(12) United States Patent
Liu et al.

(10) Patent No.: US 7,718,481 B2
(45) Date of Patent: May 18, 2010

(54) SEMICONDUCTOR STRUCTURE AND METHOD OF MANUFACTURE

(75) Inventors: Xuefeng Liu, South Burlington, VT (US); Robert M. Rassel, Colchester, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 11/279,934

(22) Filed: Apr. 17, 2006

(65) Prior Publication Data
US 2007/0241421 A1 Oct. 18, 2007

(51) Int. Cl.
*H01L 21/8238* (2006.01)

(52) U.S. Cl. ............... 438/199; 438/210; 438/213; 257/E21.632

(58) Field of Classification Search ......... 430/309–330; 438/199–217, 309–361; 257/E21.632
See application file for complete search history.

(56) References Cited

U.S. PATENT DOCUMENTS

| | | | |
|---|---|---|---|
| 4,005,469 A | 1/1977 | Chang et al. | |
| 4,644,383 A | 2/1987 | Akcasu | |
| RE34,158 E | * 1/1993 | Watanabe et al. | 257/42 |
| 5,376,816 A | * 12/1994 | Nishigoori et al. | 257/370 |
| 5,422,501 A | 6/1995 | Bayraktaroglu | |
| 5,485,027 A | * 1/1996 | Williams et al. | 257/343 |
| 5,882,977 A | * 3/1999 | Dunn et al. | 438/353 |
| 6,365,447 B1 | * 4/2002 | Hebert et al. | 438/203 |
| 6,927,460 B1 | * 8/2005 | Leibiger et al. | 257/378 |
| 7,254,783 B2 | 8/2007 | Stannard | |
| 7,329,940 B2 | 2/2008 | Coolbaugh et al. | |
| 2001/0042867 A1 | 11/2001 | Furuhata | |
| 2002/0084506 A1 | 7/2002 | Voldman et al. | |
| 2003/0094673 A1 | 5/2003 | Dunn et al. | |
| 2003/0155614 A1 | * 8/2003 | Kaneko et al. | 257/349 |
| 2004/0227210 A1 | 11/2004 | Tilke et al. | |
| 2005/0077571 A1 | * 4/2005 | Kanda et al. | 257/337 |

* cited by examiner

*Primary Examiner*—H. Jey Tsai
(74) *Attorney, Agent, or Firm*—Anthony J. Canale; Greenblum & Bernstein P.L.C.

(57) ABSTRACT

A structure comprises a deep subcollector buried in a first region of a dual epitaxial layer and a reachthrough structure in contact with the deep subcollector to provide a low-resistive shunt which prevents CMOS latch-up for a first device. The structure may additionally include a near subcollector formed in a higher region than the deep subcollector and under another device. At least one reachthrough electrically connects the deep subcollector and the near subcollector. The method includes forming a merged triple well double epitaxy/double subcollector.

20 Claims, 7 Drawing Sheets

SEMICONDUCTOR STRUCTURE AND METHOD OF MANUFACTURE

The U.S. government has a paid up license in this invention and the right in limited circumstances to require the patent owner to license others on reasonable terms as provided for by the terms of contract number N66001-02-C-8014 awarded by the Defense Advanced Research Projects Agency (DARPA).

FIELD OF THE INVENTION

The invention relates generally to a semiconductor structure and method of manufacturing and more particularly to a merged triple well double epitaxy/double subcollector structure without deep trench (DT) or trench isolation (TI) structures.

BACKGROUND OF THE INVENTION

CMOS (complementary metal oxide semiconductor) circuits are widely used in many applications such as, for example, battery-powered devices such as portable computers and cellular telephones. CMOS is a very effective device configuration for implementation of digital functions due to very low power consumption and dissipation as well minimization of the current in the "off" state.

In implementation, CMOS semiconductors comprise both n-channel and p-channel MOS field effect transistors (MOSFETs), i.e., use both n-channel MOSFETs, and p-channel MOSFETs. However, in CMOS structures, parasitic current paths exists associated by so-called parasitic bipolar transistors, which, under normal conditions, are not activated. CMOS latchup can occur when the parasitic bipolar transistors are activated. Activation can be initiated by voltage or current perturbations, or ionizing radiation. CMOS latchup occurs when regenerative feedback occurs between the npn and pnp parasitic bipolar transistors. Latchup can lead to destructive failure of the semiconductor chip. The latch-up problem will adversely affect the CMOS device and more particularly will degrade its performance.

Various CMOS designs have been conceived to prevent the latch-up problem. For example, it is known to increase the spacing between devices which, in turn, increases the effective base width of the parasitic transistors. As should be understood, with such a design, the bi-polar current will decrease as the base width increases. Thus, in such a design, as the N-diffusion moves away from the N-well, or the P-diffusion moves away from the N-well edge, or vertically, CMOS latch-up is less likely to occur.

Another approach to reducing CMOS latchup sensitivity has been to increase doping concentrations. For example, by increasing the doping concentrations, the minority carrier lifetime is decreased; when the doping is in the base region, the bipolar current gain decreases. In a further design, isolation structures have been provided to prevent the latch-up. For example, isolation structures can be placed deeper than the junctions in which case current cannot flow laterally. In other techniques, "parasitic" collectors can be provided as a current "sink".

As technology scales, however, the spacing between the P+ diffusion and the N-well and the N+ diffusion and N-well spacing become smaller. Thus, due to the scaling, previous techniques to prevent latch-up are becoming more problematic. For example, it is more difficult to increase the doping in specific areas, since the increase in dopants will increase the out-diffusion of the dopants which, in turn, increases the capacitance of the device (at the junctions) impacting circuit performance. Also, as for isolation structures, as P+ to N+ space is scaled to maintain the aspect ratio of the isolation; hence the isolation structure becomes shallower every generation, not deeper.

SUMMARY OF THE INVENTION

In a first aspect of the invention, a structure comprises a deep sub-collector buried in a first region of a dual epitaxial layer and a reachthrough structure in contact with the deep sub-collector to provide a low-resistive shunt which prevents forward active states of the bipolar transistor, enhancing the CMOS latch-up robustness of a first device.

In a second aspect of the invention, a multi-circuit structure comprises a deep sub-collector formed in a first region under a first device and a second device and a "near sub-collector" formed in a second region under the second device. The "near sub-collector" is formed in a higher region under the second device than the "deep sub-collector." A low resistive path electrically connects the deep sub-collector and the near sub-collector.

In another aspect of the invention, a method of forming a structure comprises forming a first sub-collector in a first layer under at least a first device and forming a second layer on the first layer. The method further includes forming at least one reach-through in the first layer and the second layer linked to the first sub-collector.

DESCRIPTION OF EMBODIMENTS OF THE INVENTION

The invention relates to a semiconductor structure and method of manufacturing. In embodiments, the invention more specifically relates to a method of manufacture forming a merged triple well (TW) double epitaxy/double subcollector structures without deep trench (DT) or trench isolation structure (TI). In embodiments, the processing steps implemented by the invention minimizes P+/N+ space, while preventing CMOS latch-up, e.g., prevents the structure going from low current/high voltage to high current/low voltage. The invention may be suitable for CMOS, RF CMOS, RF BiCMOS, RF BiCMOS SiGe, RF BiCMOS SiGe Carbon (SiGeC), bipolar SOI and HBT, to name a few devices.

Figure 1:
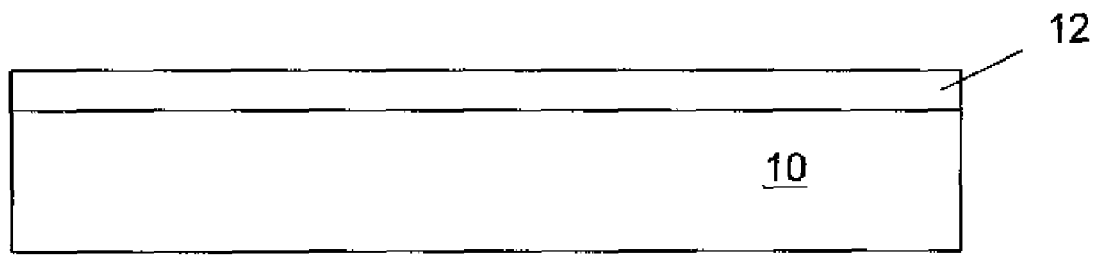
FIGS. 1-13 show process steps for forming the final structure shown in FIG. 13, in accordance with the invention.

Referring to FIG. 1, a starting structure is shown, which includes a substrate 10. In one embodiment, the substrate may be silicon, although other materials may equally be used such as, for example, SOI. In embodiments, a pad oxide 12 may be formed over the substrate 10.

Figure 2:
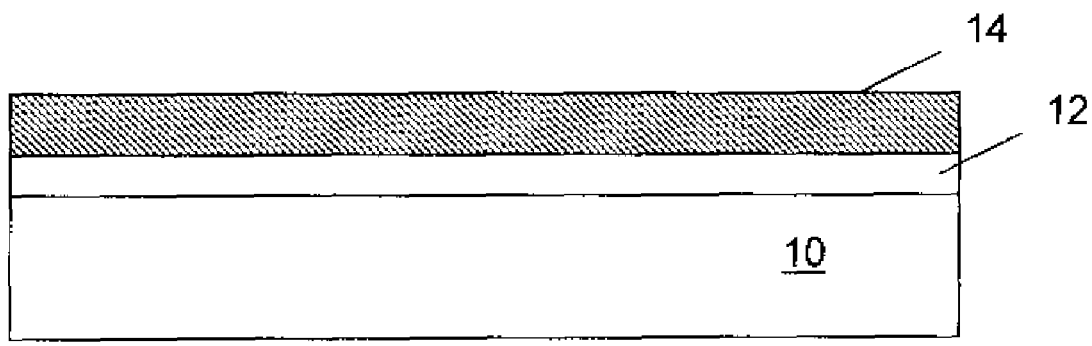
Figure 3:
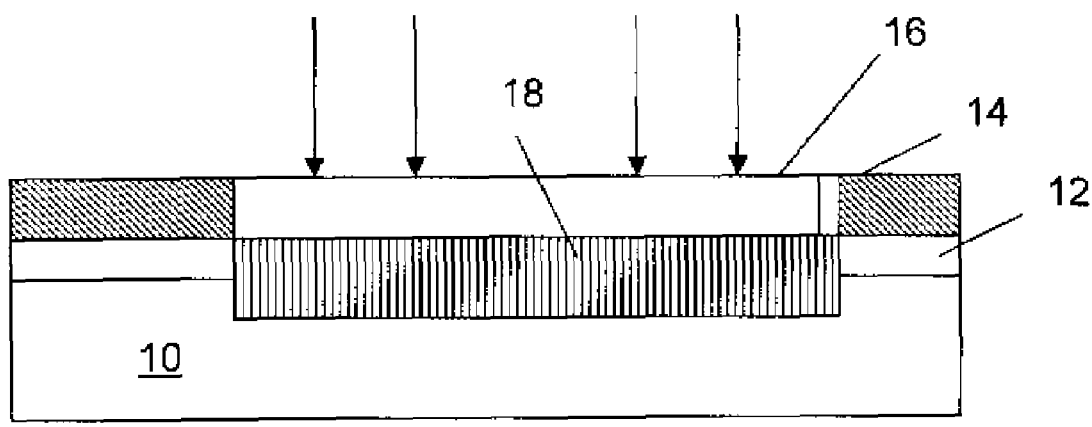

In FIG. 2, a photo-resist 14 is formed over the pad oxide 12. In FIG. 3, the photoresist 14 is exposed in order to open a window 16 to the underlying layer(s). The formation of the window 16 is formed in a well-known semiconductor photoresist process such as, using spin on glass techniques. As such, a description of the photoresist process is not necessary for a person of ordinary skill in the art to practice this particular step.

In FIG. 3, after the window 16 is opened in the photoresist 12, the method of fabrication continues by doping, e.g., ion implanting, the exposed underlying layer(s) with well-known dopants to form a deep subcollector. In one illustrative embodiment, the dopant element for a subcollector may include, for example, arsenic (As), antimony (Sb), phosphorous (P) or other N-doped elements. In one implementation, doping occurs at a common energy level and dosage, well known to those of skill in the art (e.g., in the energy range of approximately 20-60 KeV and dose of $10^{19}$ cm$^3$). The ion implantation process forms the deep subcollector 18, e.g., deep N+, extending into the underlying layer(s).

The deep subcollector 18 will serve as an isolating structure (and parallel resistor with a near subcollector) to prevent latch-up. The deep subcollector 18 may be used as a PIN diode cathode, or high breakdown NPN HBT subcollector in the final structures, for example, an NPN HBT transistor. The deep subcollector 18 may also be used in a final structure such as, for example, a varactor, or Schottky diode, to name a few.

Figure 4:
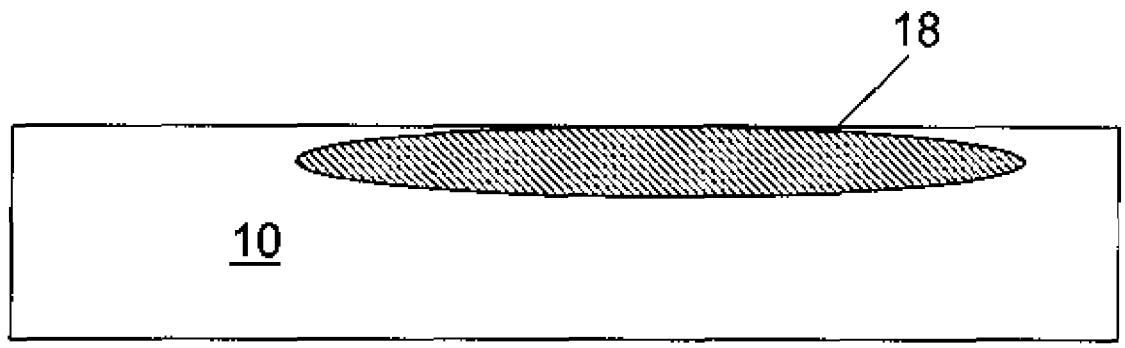

Referring to FIG. 4, the photoresist layer 12 is stripped using conventional processes. In this processing step, the pad oxide 12 may also be stripped, e.g., etched, using conventional processes. In embodiments, the stripping process removes any implant damage that occurred during the doping process described above.

Figure 5:
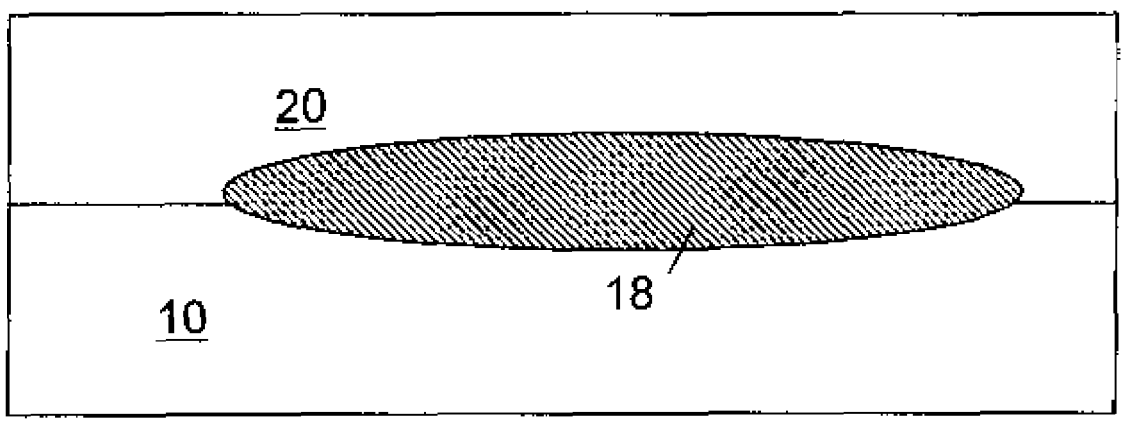

In FIG. 5, an epitaxial (epi) layer 20 is formed over the substrate 10. In embodiments, the deep subcollector 18 grows into the epitaxial (epi) layer 20. The epi layer 20 may form a P− layer. The epi layer 20 may range from approximately 1.5 to 5 um which effectively pushes down the deep subcollector 18 from a surface of the device. In embodiments, by dropping the deep subcollector deep below the surface, it is possible to decrease the vertical NPN gain of a traditional triple-well process. Thus, even without a near subcollector the present invention provides an advantage over known triple-well processes.

Figure 6:
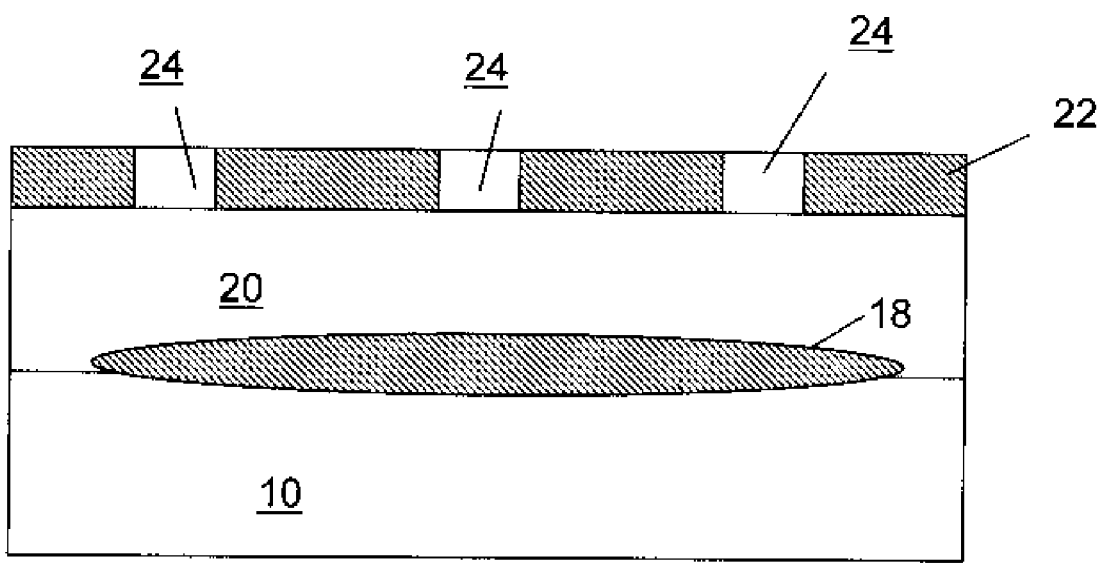

In FIG. 6, a photoresist layer 22 is formed over the epi layer 20. In one embodiment, a pad oxide layer may be formed over the epi layer 20, prior to the formation of the photoresist layer 22. In a conventional fabrication process, the photoresist layer 22 is exposed to light to open windows 24.

Figure 7:
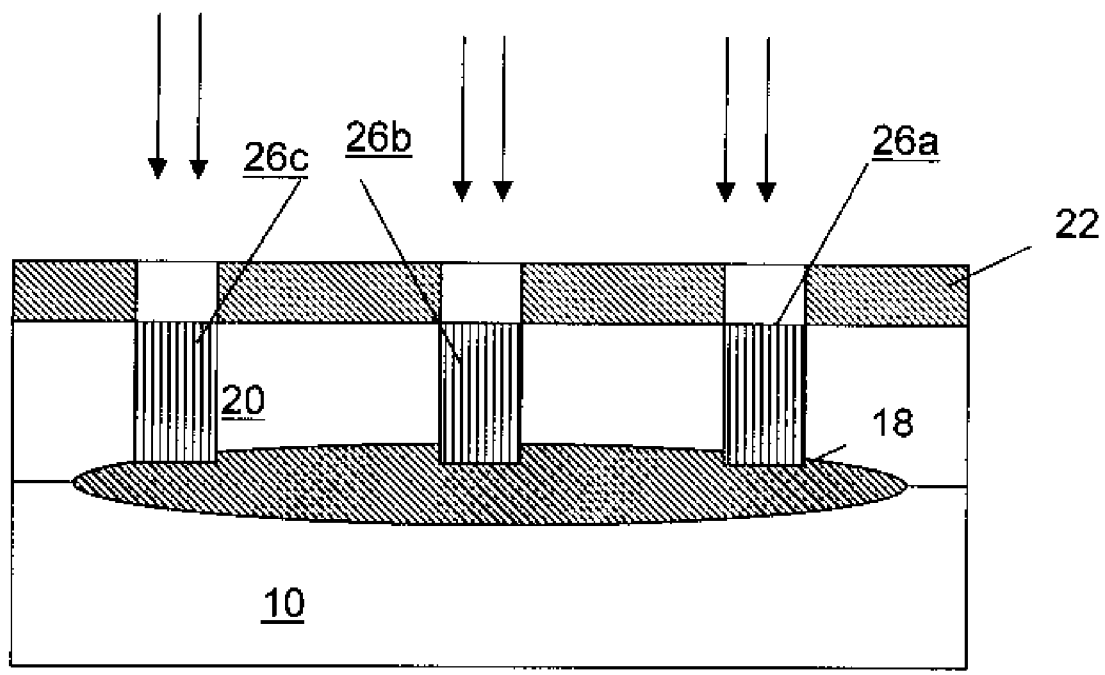

In FIG. 7, an ion implantation process is performed using dopants such as, for example, arsenic (As), antimony (Sb), phosphorous (P) or other N-doped element to form reachthroughs (RD) as shown in regions 26a-26c. The reachthroughs 26a-26c work as a conducting channel or low resistance connection to the deep subcollector 18. In embodiments, the middle and left end reachthroughs 26b, 26c, as illustrated, form a new region. In embodiments, the first epitaxial layer 20, deep subcollector 18 and a reachthrough are used to form an isolated p-well region.

The photoresist layer 22 (and, in embodiments, the pad oxide layer) may then be stripped using conventional processes. Any damage from the ion implanting process may be repaired during this stripping process.

Figure 8:
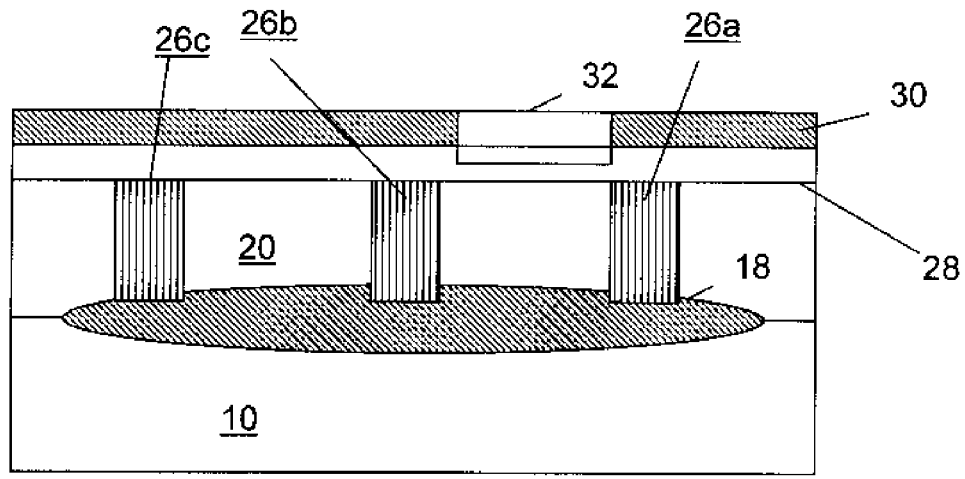

In FIG. 8, an optional pad oxide layer 28 and another photoresist layer 30 are formed over the epi layer 20, in any conventional manner. For example, as with the previous steps, the pad oxide layer 28 may be thermally grown or deposited. In conventional semiconductor processing steps, a window 32 is opened in the photoresist layer 30, over the deep subcollector 18 (or CMOS side of the device).

Figure 9:
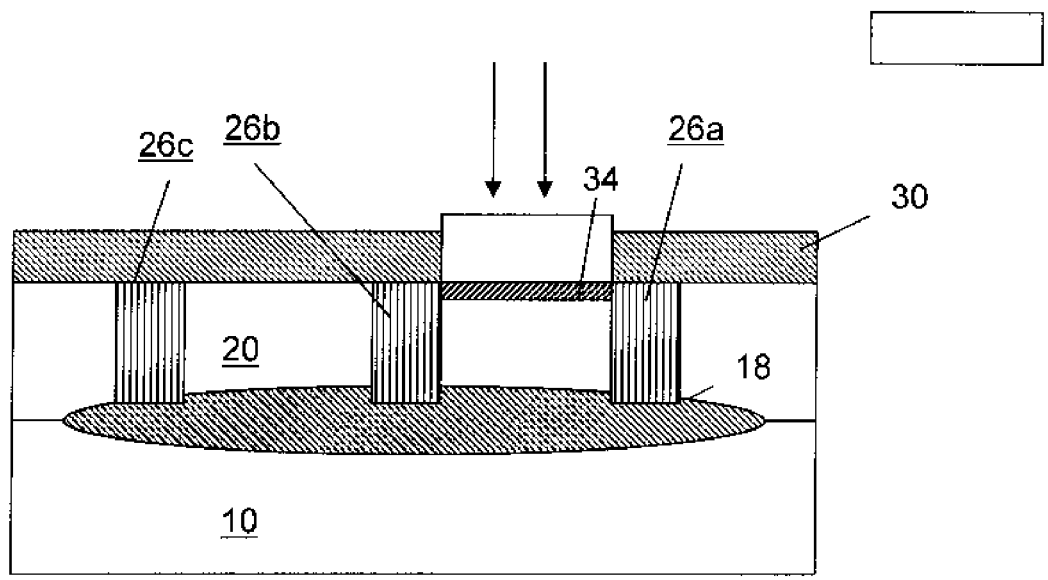

In FIG. 9, a conventional ion implantation process is performed using dopants such as, for example, arsenic (As), antimony (Sb), phosphorous (P) or other N-doped elements to form a near subcollector 34 within the epi layer 20. The near subcollector 34 may be formed by doping methods, known to those of skill in the art. In embodiments, the near subcollector 34 is provided on the CMOS MOSFET structure area (e.g., the side having N-channel and P-channel MOSFET transistors) of the device and is formed substantially parallel with the deep subcollector 18 to form parallel subcollector low-resistance paths underneath the structure. (In traditional systems, the CMOS side of a device does not include the near subcollector 34.) In embodiments, the near subcollector 34 may be used to lower the parasitic vertical gain of a vertical parasitic pnp.

The near subcollector 34 and the deep subcollector 18 are electrically connected via the reachthroughs 26a, 26b. Thus, in embodiments, the reachthroughs 26a, 26b work as a conducting channel or low resistance connection between the near subcollector 34 and the deep subcollector 18 (e.g., the reachthroughs 26 (26a) provide a lateral reduction of the lateral bi-polar gain).

In embodiments, the near subcollector 34 and the deep subcollector 18 may be merged together within the epi layer 20. This arrangement will provide an electrical short between the near subcollector 34 and the deep subcollector 18. This merging may be a function of the thickness of the epitaxial layer 20; that is, the thinner the epi layer 20, the more likely the near subcollector 34 and the deep subcollector 18 will grow together. In embodiments, the reachthroughs 26a-26c may be eliminated when the near subcollector 34 and the deep subcollector 18 are merged. In any of the above arrangements, two lateral resistances are created by shorting the near subcollector 34 and deep subcollector 18. These arrangements will prevent CMOS latch-up or a highly conductive path between, for example, the NMOS and PMOS parts of CMOS structure.

The sheet resistance of the near subcollector 34 and the deep subcollector 18 is, in embodiments, 1 to 10 ohm/square. It should be recognized, though, that the sheet resistance of the near subcollector 34 and the deep subcollector 18 can range from approximately 0 to 300 ohm/square.

Still referring to FIG. 9, the photoresist layer 30 is stripped using a conventional process, with the pad oxide 28 being stripped of thereafter. In one embodiment, this stripping process removes any implant damage that occurred during the doping process described above.

Figure 10:
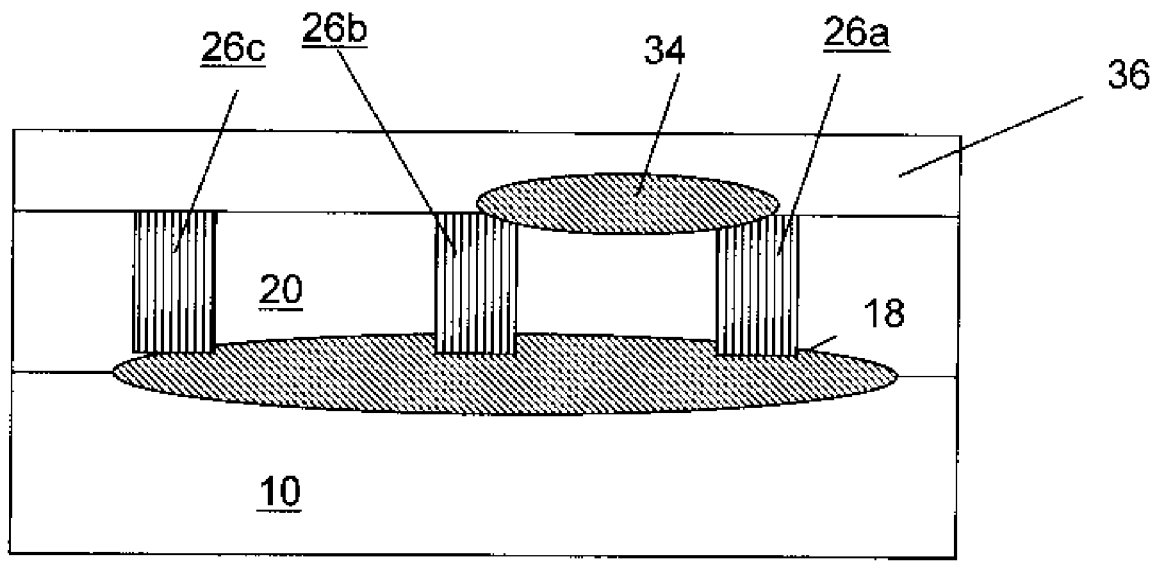

In FIG. 10, in accordance with a dual epi process of the invention, a second epi layer 36 is formed over the structure. In particular, the epi layer 36 is formed over the near subcollector 34. In embodiments, the near subcollector 34 will grow up into the epi layer 36. The second epi layer 36 can be fabricated to have a wide thickness flexibility to provide tunability of the devices. In an embodiment of the invention, the epi layer 36 is approximately in the range of 0.25 to 5 um, which may be in the same range as the thickness of the epi layer 20. In any scenario, the tunability of the second epi layer 36 provides advantages over known fabrication methods. In embodiments, the second epi layer 36 effectively lowers the deep subcollector deeper below the surface, thus decreasing the vertical NPN gain of a traditional triple-well process.

Figure 11:
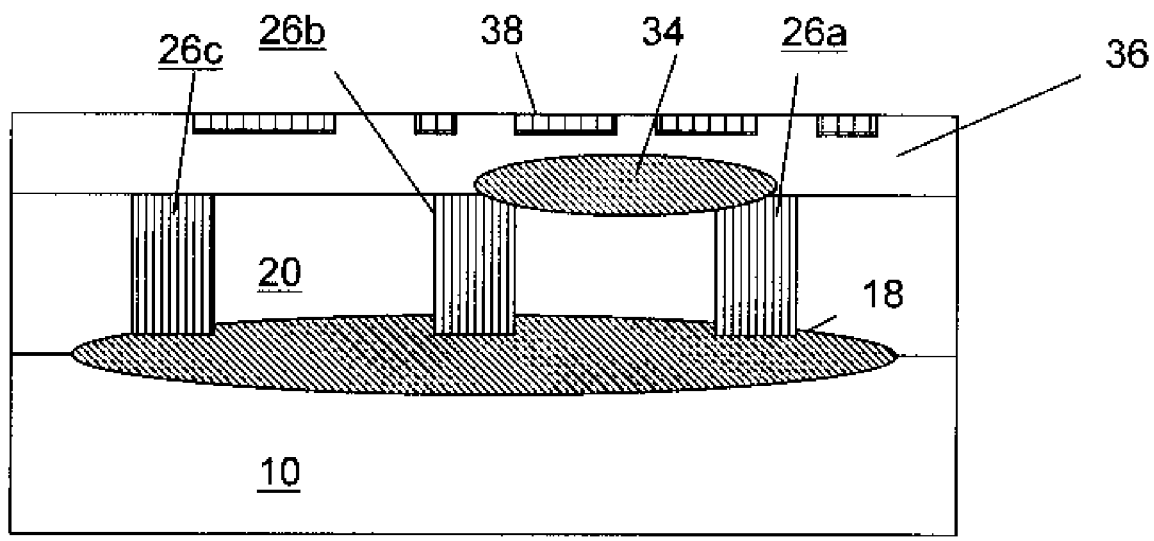

In FIG. 11, shallow trench isolation structures 38 are formed in conventional processes. The shallow trench isolation structures 38 are formed for device isolation purposes in the p-wells and n-wells, as is shown, for example, in FIGS. 13-15. Alternatively, isolation structures may comprise local oxidation of silicon ("LOCOS") structures. The isolation structures are integrated with the reachthroughs 40, as shown in FIG. 12.

Figure 12:
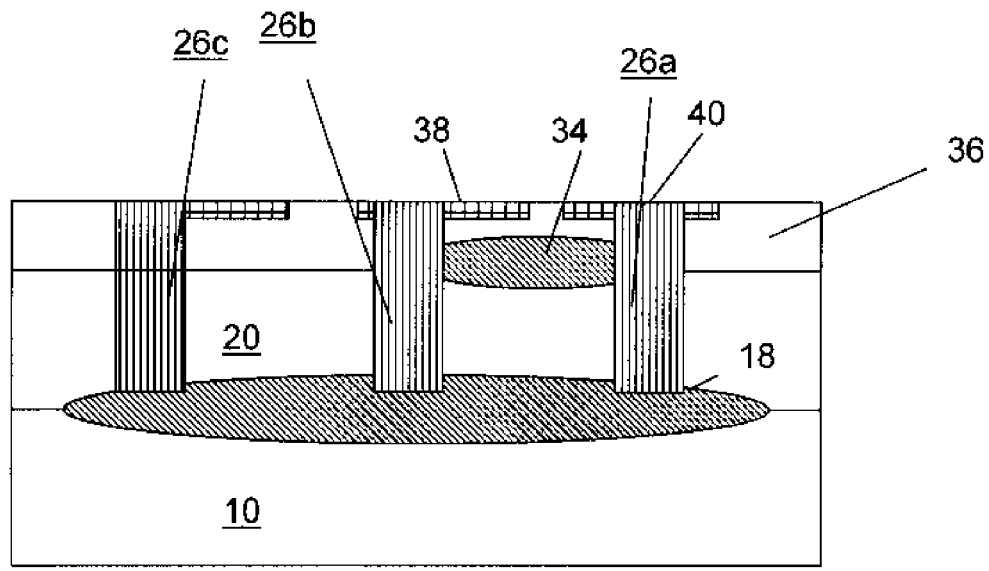

In FIG. 12, the reachthroughs 40 are formed in the second epi layer 36. The reachthroughs 40 can be formed in any conventional manner, as described with reference to the reachthroughs 26a-26c. For example, the reachthroughs 40 may be formed by ion implantation with species such as dopants such as, for example, phosphorous (P), antimony (Sb) or other N-doped elements, using known implant energies. In embodiments, the reachthroughs 40 are stacked on the reachthroughs 26a-26c and, additionally, are integrated with the near subcollector 34 to provide a conducting channel to link with the near subcollector 34. The reachthroughs 40 act as a border for the N-well region (e.g., FIG. 13) to eliminate the lateral bipolar gain.

Figure 13:
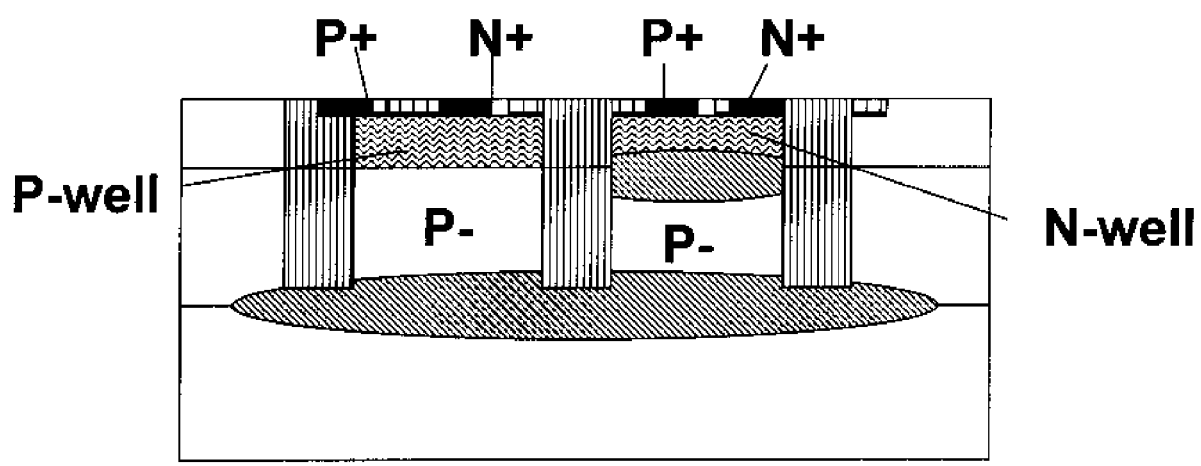

FIG. 13 shows a final structure in accordance with the invention. In this embodiment, a P-well implant and an N-well implant are formed in the epi layer 36, and a P+ film and an N− film are grown in selective areas on the structure. For example, a P+ film is grown selectively over the epi layer 36 in a conventional epitaxial manner, such as LTE, LPCVD, CVD, etc. The N+ diffusion region can be any N-type device such as, for example, an N-well diode, an NFET, an N-resistor, etc; whereas, the P+ diffusion region can be any P-type device such as, for example, a P-channel MOS, a P-diode, etc. Other processes details are not shown here but should be known to those of skill in the art, e.g., forming passive components, interconnect metallization, etc.

As should further be understood in view of the above discussion and accompanying structures, the middle region of the structure is a P+, N+, P-N, where the near sub-collector and deep sub-collector are shorted. In this manner, a vertical PNPN is formed, where the first N-region and the second N-region are shorted together, and accordingly the device never turns on. As to lateral current flow of the parasitic PNP, such flow has to go through the reachthrough 40 which will eliminate the lateral device current gain between the P-well and N-well, which, in turn, improves the reduction of the lateral bi-polar current gain of the PNP. In embodiments a PNP is created when the near subcollector and deep subcollector merge, e.g., P+, N-well, P− device is created. Also, the combined low-sheet resistance of the two subcollectors acts as a lateral shunt.

Additionally, as should be understood by those of skill in the art, in the structure of the invention, it is possible to go from the N-plus diffusion to the near subcollector 34, underneath the P-diffusion, thus producing a low-resistance shunt underneath the P+ device. Also, the structure shown herein is a triple well structure, i.e., having an isolated P-well region, an N-well region, and chip substrate. (The P-well sitting on top of a P− epi region is an isolated well). Also, the P+ region (on the left side of the structure) serves as a contact to the P-well P− region, which is a substrate contact. And, the N+ diffusion (to the right of the structure) is the N-well contact, which is contacting the reachthrough 40, reachthrough 26a, the near subcollector, the deep subcollector, and the N-well. Thus, this arrangement is serving as a low-resistance contact to the whole structure.

Figure 14:
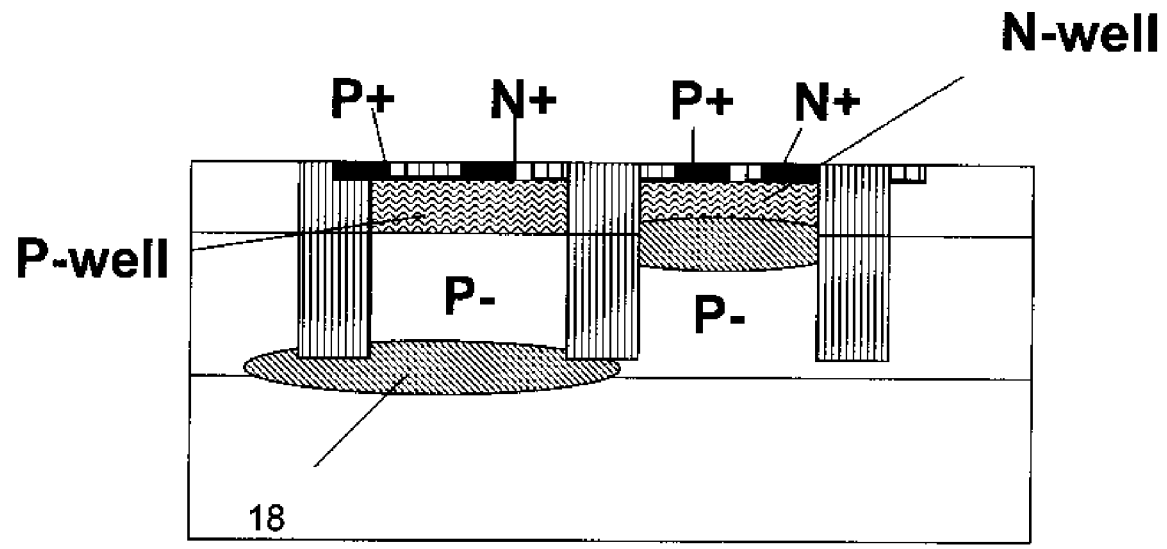
FIG. 14 shows an alternate final structure in accordance with the invention.

In the embodiment of FIG. 14, the deep subcollector 18 is formed only under the P-well. In this manner, the deep subcollector 18 acts as an isolating region for the P-well and the P+. In this embodiment, the reachthrough 26b provides a conductive path between the deep subcollector 18 and the near subcollector 34. The device of FIG. 14 can be fabricated according to the above methods.

Figure 15:
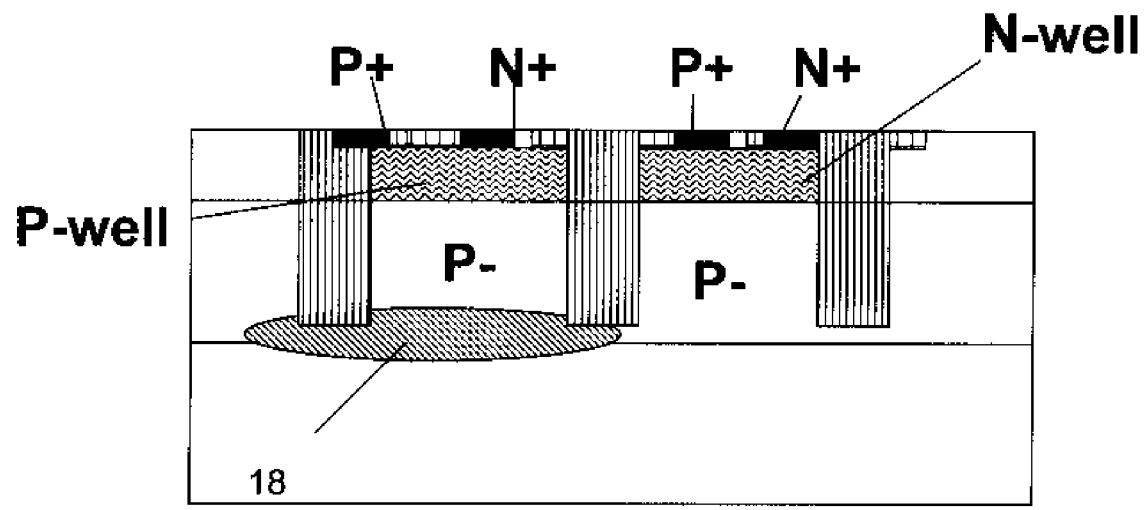
FIG. 15 shows an alternate final structure in accordance with the invention.

In the embodiment of FIG. 15, the deep subcollector 18 is formed only under the P-well and the near subcollector 34 is eliminated; although the reachthroughs remain in contact with the deep subcollector 18. The reachthroughs are in contact with the deep subcollector 18 to shunt the device (provide a resistive path). The device of FIG. 15 can be fabricated according to the above methods.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

The invention claimed is:

1. A method of forming a structure, comprising:
   providing a substrate including a first epitaxial layer;
   forming a first subcollector in the first epitaxial layer;
   forming a second epitaxial layer over the first epitaxial layer;
   forming, over the first subcollector, stacked reachthroughs in the first epitaxial layer, wherein the second epitaxial layer is linked to the first subcollector; and
   after a portion of each stacked reachthrough is formed, forming a second subcollector in the second epitaxial layer above the first subcollector, the second subcollector being arranged between and in contact with the stacked reachthroughs,
   wherein portions of the stacked reachthroughs act as a border for an implanted N-well region arranged above the second subcollector, and
   wherein the method prevents CMOS latch-up.

2. The method of claim 1, wherein the second subcollector is arranged under a first device and a second device, and wherein:
   the first device is the N-well and the second device is the P-well;
   each stacked reachthrough contacts the first subcollector and the second subcollector to form a resistive path, and
   the second device is a complementary metal oxide semiconductor.

3. The method of claim 1, wherein the first subcollector is a deep subcollector buried in a first region of a dual epitaxial layer defined by the substrate and the first epitaxial layer and the first epitaxial layer of the dual epitaxial layer, the deep subcollector and the stacked reachthroughs form an isolated p-well region.

4. The method of claim 1, wherein the second subcollector is formed by:
   forming the first epitaxial layer over the substrate;
   forming a photoresist layer over the first epitaxial layer;
   opening a window in the photoresist layer;
   performing an ion implantation process to form the second subcollector; and
   forming the second epitaxial layer over the first epitaxial layer, wherein the second subcollector grows up into the second epitaxial layer.

5. The method of claim 1, wherein the second subcollector is formed substantially in parallel with the near subcollector to form parallel subcollector low-resistance paths.

6. The method of claim 1, wherein the stacked reachthrough extends through the first epitaxial layer and the second epitaxial layer to the first subcollector.

7. A method of forming a multi-circuit structure, comprising:
   forming a deep subcollector in a first region such that the formed structure will utilize the deep subcollector under one or more of a first device and a second device;

covering the deep subcollector with at least one epitaxial layer;

forming a near subcollector in a second region under the second device, the near subcollector being formed in a higher region under the second device than the deep subcollector, and extending into a second epitaxial layer; and before the near subcollector is formed, forming at least one reachthrough which, after the near subcollector is formed, provides a resistive path electrically connecting the deep subcollector and the near subcollector, wherein the first device is a P-well and the second device is an N-well, wherein at least one of:
portions of two of the at least one reachthrough act as a border for the N-well; and
the deep subcollector is formed under the P-well and not under the N-well, and wherein the method prevents CMOS latch-up and the reachthroughs do not extend below the deep subcollector.

8. The method of claim 7, wherein the second device is a complementary metal oxide semiconductor device.

9. The method of claim 7, further comprising forming at least two reachthroughs extending on sides of the second device configured to prevent latch-up conditions.

10. The method of claim 7, further comprising forming three reachthroughs, wherein a middle reachthrough of the three reachthroughs isolates the first device from the second device.

11. The method of claim 7, wherein the at least one reachthrough is a stacked structure formed from a second reachthrough stacked on a first reachthrough.

12. The method of claim 7, wherein the at least one reachthrough extends at least partially through at least two epitaxial layers to the deep subcollector.

13. The method of claim 7, further comprising shallow isolation regions formed in the first region and the second region, the at least one reachthrough contacting the shallow isolation regions of the second device.

14. A method of forming a structure, comprising:
forming a first epitaxial layer over a first subcollector;
forming first, second and third reachthroughs in the first epitaxial layer, wherein at least two of the first, second, and third reachthroughs provide a conductive channel or low resistance connection to the first subcollector;
after the first, second, and third reachthroughs are formed, forming a second subcollector in contact with the second and third reachthroughs; and
forming a second epitaxial layer over the first, second, and third reachthroughs and the second subcollector,
wherein at least one of:
portions of the second and third reachthroughs act as a border for an implanted N-well arranged above the second subcollector; and
the first subcollector is formed under the first and second reachthroughs and under a P-well and not under an N-well.

15. The method of claim 14, wherein the method prevents CMOS latch-up, wherein the first, second, and third reachthroughs eliminate lateral bipolar gain.

16. The method of claim 14, wherein the method prevents a highly conductive path between an NMOS part and a PMOS part of a CMOS structure.

17. The method of claim 14, wherein the first and second subcollectors are merged together within the first epitaxial layer.

18. The method of claim 14, further comprising forming shallow trench isolation structures in the second epitaxial layer, wherein each shallow trench isolation structure is integrated with the first, second, and third reachthroughs.

19. The method of claim 1, further comprising a P-well region arranged adjacent the N-well region, wherein the P-well region lacks any second subcollector between the P-well region and the first subcollector.

20. The method of claim 19, wherein portions of the stacked reachthroughs act as a border for the P-well region.

* * * * *